United States Patent [19]
Iga

[11] Patent Number: 5,640,350
[45] Date of Patent: Jun. 17, 1997

[54] MULTI-BIT DYNAMIC RANDOM ACCESS MEMORY CELL STORAGE

[76] Inventor: Adam Sempa Iga, 1324 S. Dinwiddie St., Arlington, Va. 22206

[21] Appl. No.: 701,081

[22] Filed: Aug. 21, 1996

[51] Int. Cl.⁶ .................................................. G11C 13/00
[52] U.S. Cl. .......................... 365/186; 365/51; 365/203
[58] Field of Search ................................ 365/186, 203, 365/210, 189.01, 51

[56] References Cited

U.S. PATENT DOCUMENTS 4,133,049  1/1979  Shirato ........................................ 365/186

*Primary Examiner*—Terrell W. Fears
*Attorney, Agent, or Firm*—Lane, Aitken & McCann

[57] ABSTRACT

A single transistor capacitor stacked memory cell utilizing precharge voltage and spacial format to miximize storage per unit of area.

7 Claims, 14 Drawing Sheets

|  | bit 15 | bit 14 | | bit 2 | bit 1 | bit 0 |
|---|---|---|---|---|---|---|
| Row Address 0 | ☐ | ☐ | | ☐ | ☐ | ☐ |
| Row Address 1 | ☐ | ☐ | | ☐ | ☐ | ☐ |
| Row Address 2 | ☐ | ☐ | | ☐ | ☐ | ☐ |
| Row Address 3 | ☐ | ☐ | | ☐ | ☐ | ☐ |
| Row Address 4 | ☐ | ☐ | | ☐ | ☐ | ☐ |
| ⋮ | | | | | | |
| Row Address 65533 | ☐ | ☐ | | ☐ | ☐ | ☐ |
| Row Address 65534 | ☐ | ☐ | | ☐ | ☐ | ☐ |
| Row Address 65535 | ☐ | ☐ | | ☐ | ☐ | ☐ |

FIG.6

MULTI-BIT DYNAMIC RANDOM ACCESS MEMORY CELL STORAGE

This application is related to U.S. application Ser. No. 08/232,806 filed on Apr. 25, 1994 and now abandoned.

BACKGROUND OF THE INVENTION

1. Field of the Invention

The present invention relates generally to a multi-bit dynamic random access memory cell and specifically to an improved multi-bit dynamic random access memory cell and method of operation so that more data per integrated circuit surface area can be stored compared to existing dynamic random access memory cells.

2. Description of the Prior Art

In the prior art, several dynamic access memory cells are provided. In one such embodiment of the prior art shown in FIG. 1, the DRAM cell has three transistors and is normally called a three-transistor (3-T) cell circuit. Charge is stored on Capacitor $C_1$ and the amount of stored charge determines what binary unit (either a 1 or a 0) is stored in the cell. Since this DRAM cell is the first widely used dynamic memory cell, its operation is well known to those who are well knowledgeable in this art.

Another prior art embodiment of a DRAM cell is shown in FIG. 2. This specific DRAM cell uses one transistor $T_{30}$ and hence it is normally called a one-transistor (1-T) DRAM cell. It is the most widely used DRAM cell in industry today. Memory cell operation is also well known to those who are knowledgeable in this art.

Both the DRAM cells of FIG. 1 and FIG. 2 have drawbacks. The 3-T DRAM cell occupies a far bigger surface area on the integrated circuit chip so that the cost of storing a single binary bit per unit surface area is very high. In addition, considerable power savings would be realized if the 3-T DRAM cell could be reduced in area. Another drawback to this 3-T DRAM cell is that it stores only a single binary bit per cell so that there is no way currently available to increase the bit density.

With regard to the 1-T DRAM cell of FIG. 2, the biggest drawback is that this is also a one bit per memory cell device so that the number of total binary bits stored in an integrated circuit chip composed of these memory cells is equal to the total number of memory cells on the IC chip. Theoretically and practically, considerably more bit number per unit IC surface area could be realized if more than one binary bit could be stored in a one-transistor memory cell of FIG. 2.

Several attempts at building a multi-bit one-transistor DRAM cell in order to increase bit density have been undertaken in recent years. One such undertaking is described by Betty Prince in her textbook titled *Semiconductor Memories: a handbook of design, manufacture and application/* Second Edition, published by Wiley on pages 332 to 336. She describes a HITACHI design and operation of a multi-bit (Multi-level) single transistor DRAM cell shown in FIG. 3A. FIG. 3B shows the staircase pulse generator and FIG. 3C shows the "Read" operation timing chart of the staircase pulse generator, all as chosen by Prince with permission of the Institute of Electrical and Electronics Engineers. As shown in the "Read" operation timing chart of FIG. 3C, when the column strobe (CS) becomes low, the staircase pulse starts to ascend and it is applied to the selected word line. The dummy word line meanwhile is driven by a half-step staircase pulse so that a half-reference voltage is read out from the dummy cell. The sense amplifier detects the signal and sends it to the column register, where the data are stored in the form of a 4-bit binary code. A data-transfer request signal (DTR) is generated when the four bits in each memory cell have been transferred to the data input and output terminals through the error correction circuit.

The bandgap reference voltage regulator protects the DRAM cell against power supply irregularities and temperature fluctuations so that the small signal voltage is accurately maintained. A refresh oscillator and an address counter are implemented on chip to perform self-refresh operation. If a read-write request comes during a refresh cycle, the request is delayed until the end of the refresh cycle.

This particular multi-bit or multi-level DRAM cell design by HITACHI had the one major drawback of the potential for soft error due to the small amount of charge that was stored in each of the four levels in the individual cell and also due to the fact that each incident alpha particle destroyed four bits of data in a cell and all other cells. Another drawback was the slow speed of operation. Random block operation is in the range of 100 microseconds and serial data rate is in the range of 210 nanoseconds. Other factors such as the slow rate of conversion between multi-level data and binary data inherently slow due to the slow iterative operation of the sense circuit.

Yet another attempt at building a multi-bit (multi-level) single transistor DRAM cell for the purpose of increasing stored bit density per unit surface area was made by TOSHIBA and is described by the above-named author in the paper quoted above. The design was based on a 2 bit per-cell DRAM in which four levels were stored in every cell. The chip, intended for the embedded memory in logic application market used a 512K cell design to give a 1-Megabit DRAM capacity. At a chip size of 37.8 square millimeters compared to the typical 1-Megabit DRAM Chip Size of about 55 square millimeters it was originally intended to improve the bit density over typical 1-Megabit DRAM. However if this memory cell is used to make a standard 1-Megabit DRAM with about 55 percent array efficiency, the chip size is about 32 square millimeters. The real comparison in density then is between 32 square millimeters for a standard 1-Megabit DRAM with this cell size and 37.8 square millimeters for the Multi-bit (multi-level) 1-Megabit DRAM.

Thus there is no chip size advantage of the multi-bit DRAM cell over existing standard DRAM cells in terms of bit density.

Several other attempts at multi-bit memory storage using other than capacitor based storage memory cells have been attempted. In U. S. patent application Ser. No. 08/414,383 filed Mar. 31, 1995 in the names of the present applicant and currently assigned to Hyundai Electronics Industries Co. Ltd., there is described a ferromagnetic memory cell apparatus and method for multi-bit storage for use as DRAM, SRAM or EEPROM cells on an integrated circuit chip, as further indication of the need to increase storage bit density in digital integrated circuit memory systems.

SUMMARY OF THE PRESENT INVENTION

It is the main object of this invention therefore to provide a dynamic random access memory cell apparatus and method for improving bit density of a one transistor DRAM cell while overcoming the drawbacks of earlier attempts at multi-bit DRAM cell designs discussed above. The problems that the present invention seeks to solve include providing safe levels or amounts of charge representing one bit of data by increasing the effective surface area of the data storage capacitor, in such a way that the surface area of the silicon wafer into which the memory cell is fabricated is not increased by the increased effective surface area of the data storage capacitor, keeping one sense amplifier to read the data stored into the memory cell instead of three sense amplifiers as earlier designs of multi-bit dynamic memory cells, so that the surface area saved is used to provide larger data storage capacitors in terms of effective surface area.

Other objects and advantages of my invention will become apparent from the consideration of the drawings and ensuing detailed description of the preferred embodiment.

BRIEF DESCRIPTION OF THE DRAWINGS

FIG. 6 shows one possible and the preferred method of arranging data in an array of memory cells of the preferred embodiment of this invention on an integrated circuit chip, whereby this array is composed of 65536 rows and 16 columns with each row able to shore up to the maximum allowed number of words with each word having 16 bits in length and with each of the 65536 addresses storing a unique word type in terms of bit arrangement within each unique word.

FIG. 12 is that FIG. 11 has only one stacked surface layer, whereas FIG. 12 has several stacked surface layers.

DETAILED DESCRIPTION OF THE PREFERRED EMBODIMENT

Figure 1:
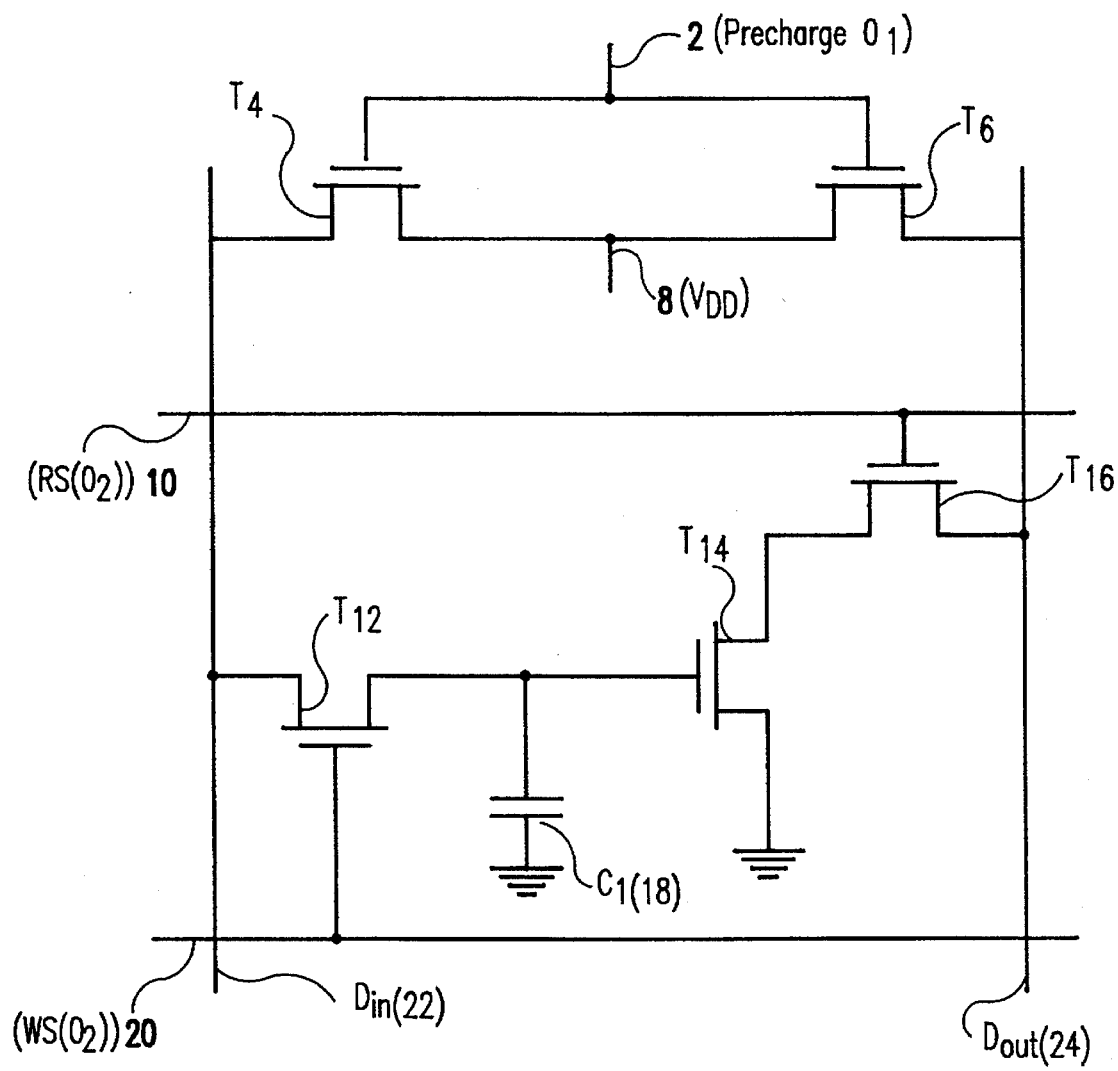
FIG. 1 is a schematic drawing of the prior art of a 3-transistor DRAM cell.
Figure 2:
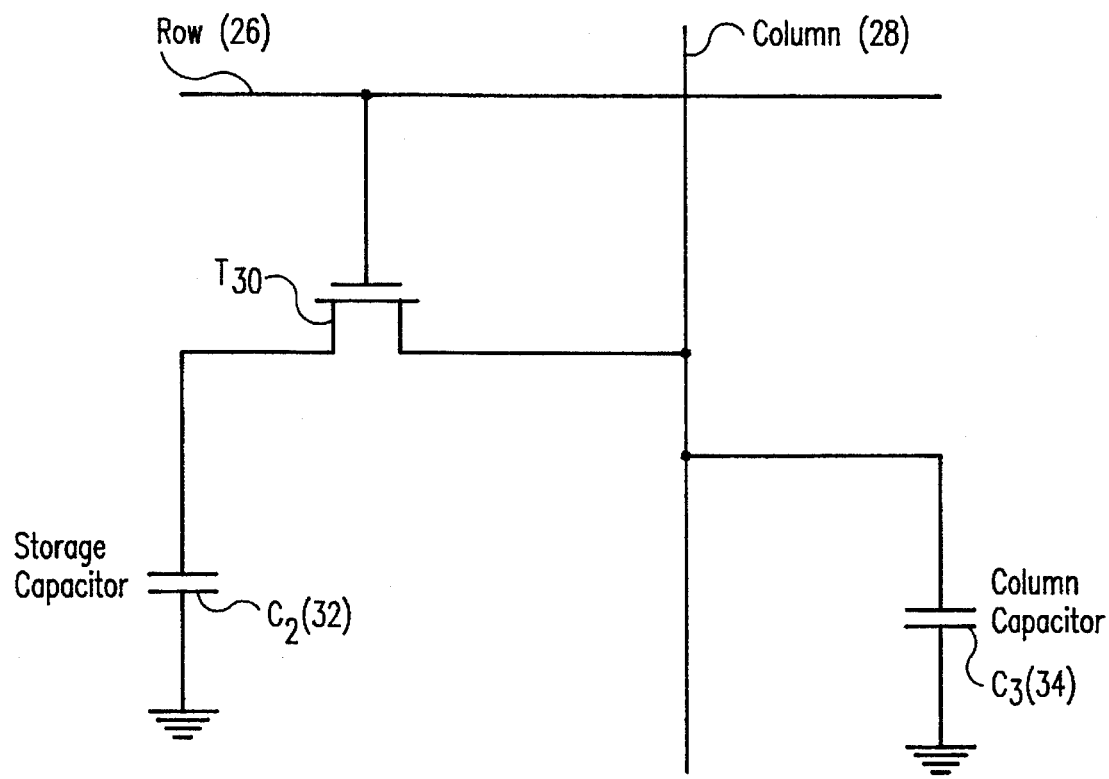
FIG. 2 is a schematic drawing of the prior art of a 1-transistor DRAM cell.
Figure 3A:
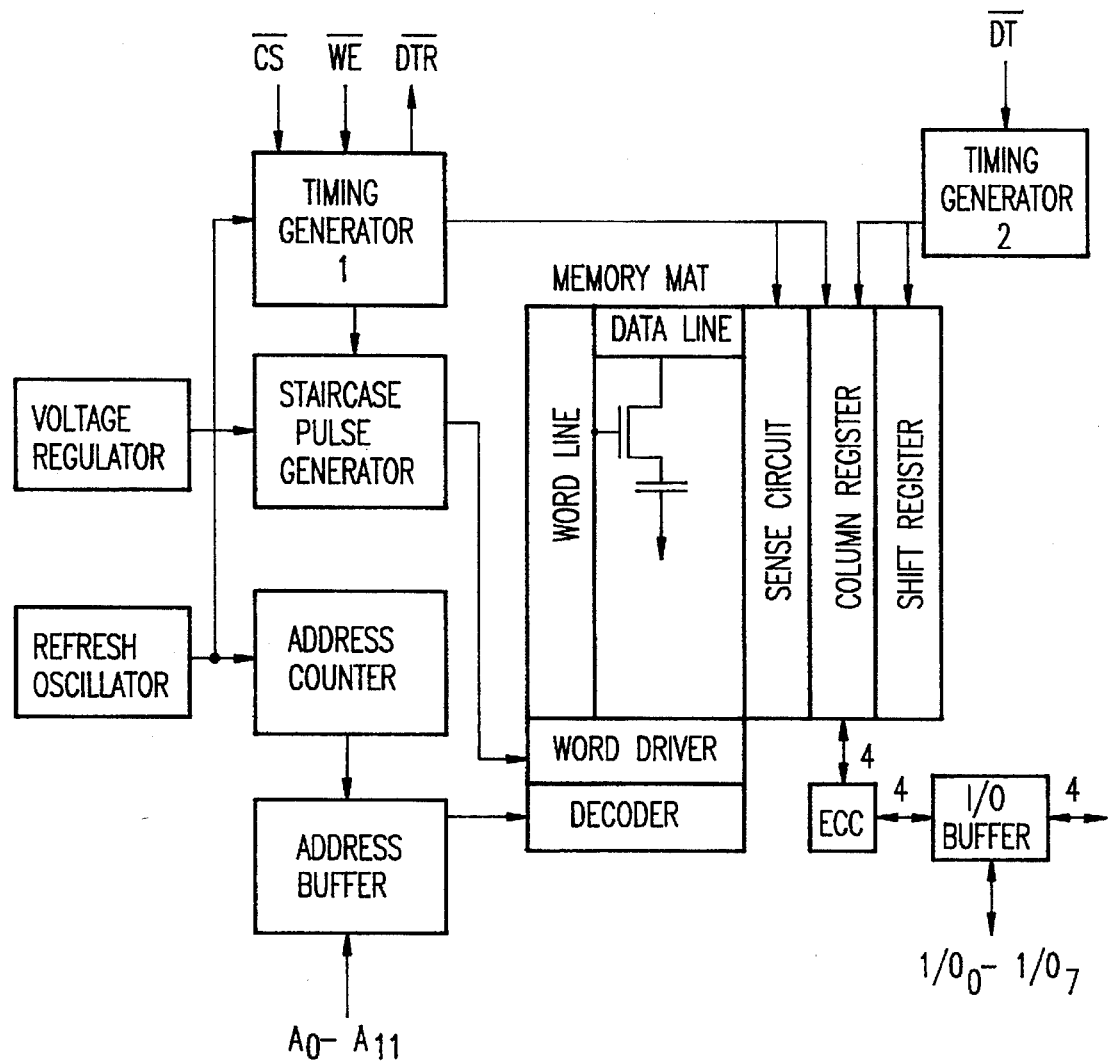
FIG. 3A is a prior art drawing of a multi-bit (multi-level) DRAM cell as proposed and designed by HITACHI LTD.
Figure 3B:
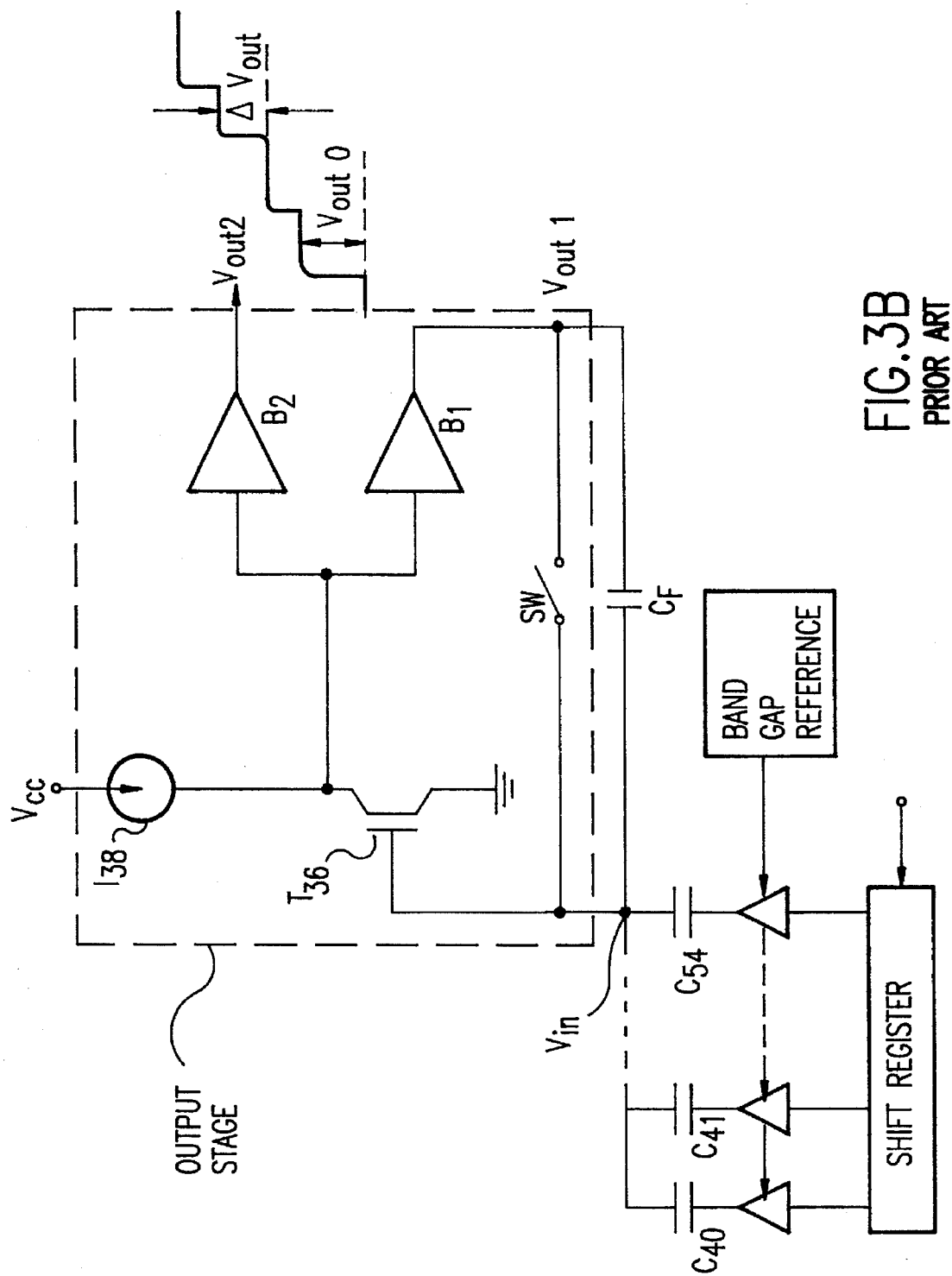
FIG. 3B shows the staircase pulse generator of the prior art multi-bit DRAM cell of FIG. 3A.
Figure 3C:
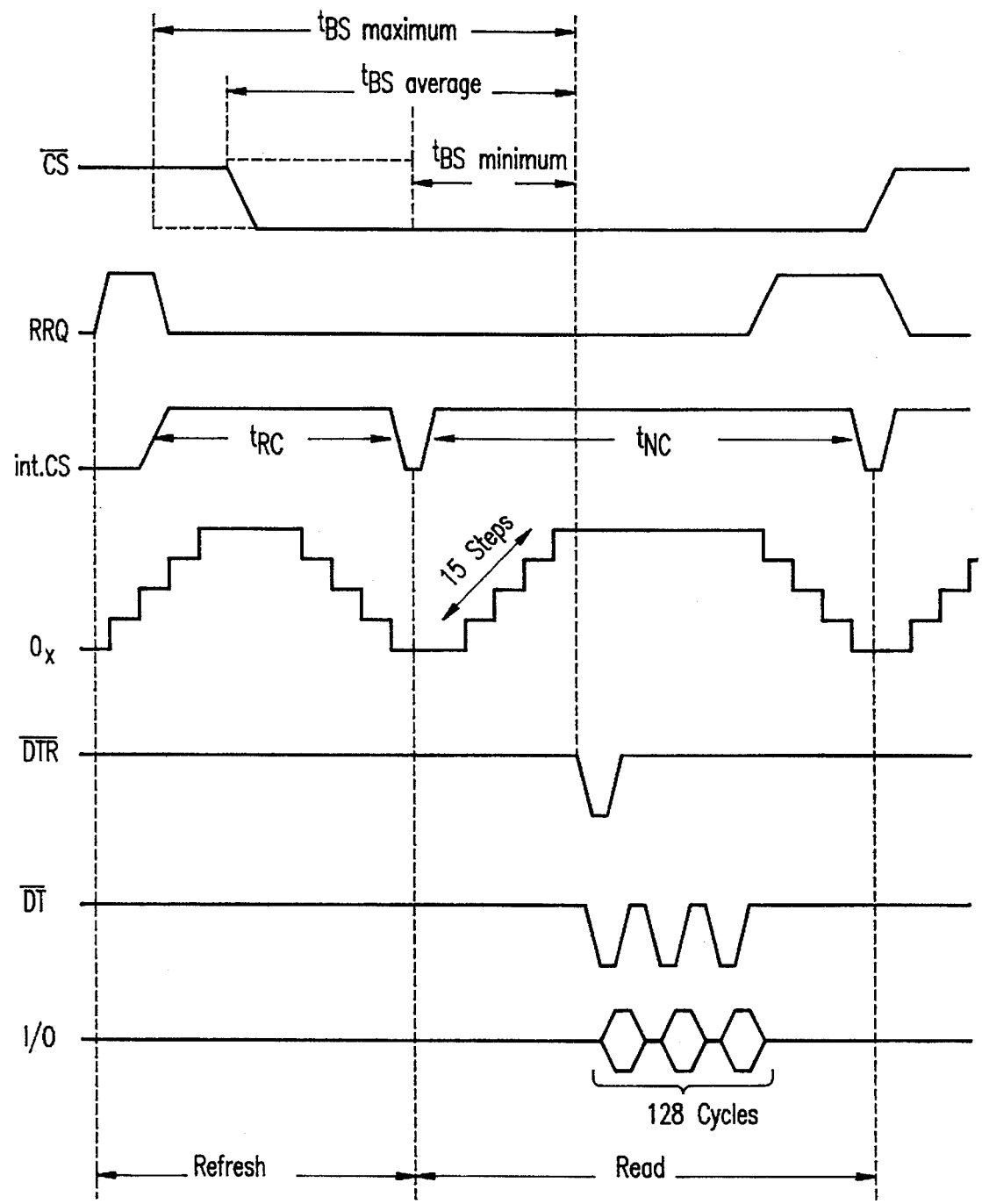
FIG. 3C shows the "Read" operation timing chart of the staircase pulse generator of FIG. 3A and FIG. 3B.
Figure 4:
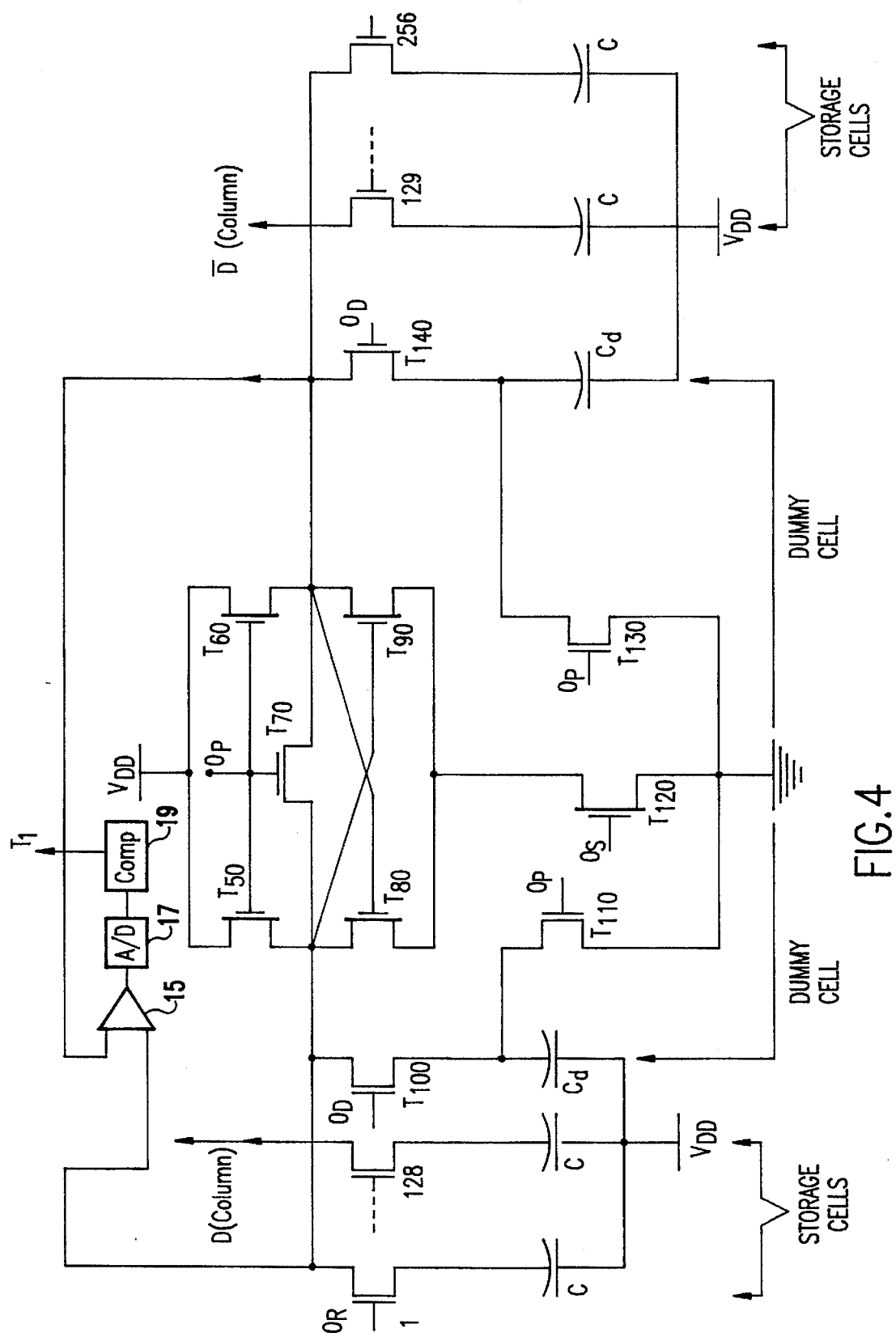
FIG. 4 shows the schematic drawing of the preferred embodiment of the present invention.
Figure 5:
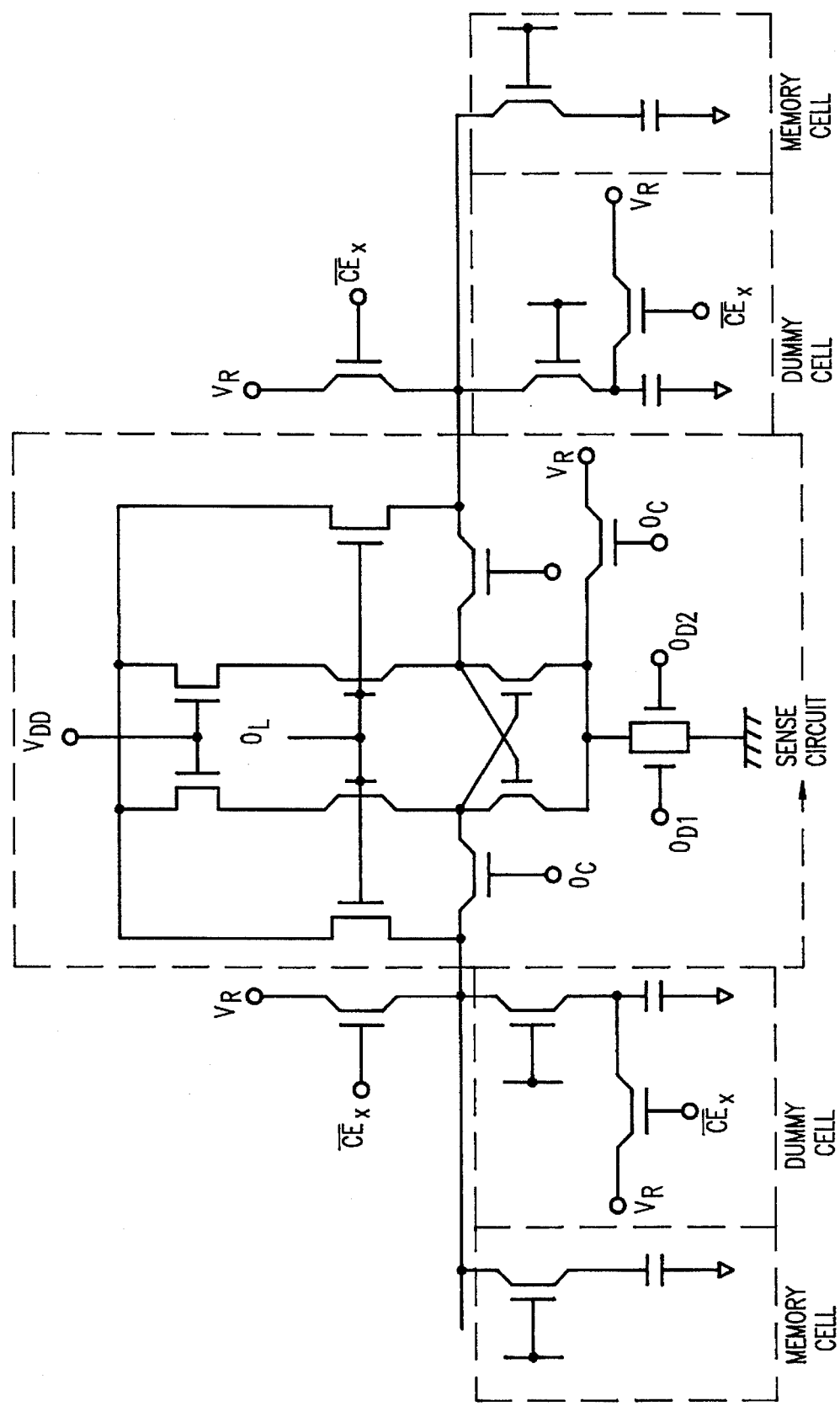
FIG. 5 shows an additional representation of the schematic diagram of the preferred embodiment of the present invention.

Now referring to either FIG. 4 and FIG. 5, both of the preferred embodiment of this invention, a one-transistor memory such as that shown in FIG. 2 is constructed in such a way that the storage capacitor is a variable capacitor, variable in the sense that it can store one or more than one predetermined minimum levels or amounts of charge so that each of the predetermined levels or amounts of charge represents a given number of binary bits of a given type. Since there are two types of binary bits, either a zero or a one, each predetermined minimum level of charge has to represent either a one bit or a zero bit. Alternatively, both a one bit and a zero bit may be represented by the same predetermined minimum amount of charge. Thus, the total number of predetermined minimum levels or amounts of charge on the data storage capacitor represents the total number of binary bits of a specified type (either type one bits or type zero bits) stored on the data storage capacitor at any one time.

Transistors $T_{50}$, $T_{60}$ and $T_{70}$ are load devices for the amplifier circuit, making it possible to deliver the supply voltage $V_{DD}$ to both the left side and the right side of the column lines circuit, when signal $O_p$ is applied.

Cross coupled transistors $T_{80}$ and $T_{90}$ are the regenerative pass of the sense amplifier where the first side of the sense amplifier to raise its voltage (column) turns on the transistor of the other side, thereby causing regenerative action and restoration of the distorted data when latch signal $O_S$ is applied to transistor $T_{120}$. This regenerative and latching process, however, applies only to the embodiment when this memory cell stores only one bit of data either a one bit or a zero bit and is not used for multi-level (multi-bit) storage.

Transistors $T_{110}$, $T_{120}$ and $T_{100}$ together with capacitor Cd complete the dummy cell on the left side of the sense amplifier while transistors $T_{120}$, $T_{130}$ and $T_{140}$ and capacitor Cd complete the dummy cell on the right side of the sense amplifier.

The memory cell is numbered from 1 to 128 on the left side of the sense amplifier and from 129 to 256 on the right side of the sense amplifier with each cell having a storage capacitor C, and a switching transistor ($T_1$–$T_{128}$; $T_{129}$–$T_{256}$) together with the column capacitance which is parasitic in nature and is represented as column capacitor $C_3$ (34) in FIG. 2. The switching transistor exhibits symmetry in construction and hence said source terminal and said drain terminal can be connected interchangeably with no change in the results of operation. Bit line means is connected to a balanced differential sense amplifier circuit means ($T_{100}$, $T_{140}$, $T_{50}$, $T_{60}$, $T_{70}$, $T_{80}$, $T_{90}$, $T_{110}$, $T_{120}$, $T_{130}$), a buffer memory or a buffer register (not shown), and a data conversion circuit means. The data conversion circuit means includes a differential amplifier 15 and A/D converter 17 and a comparator 19. It sends back an adjusted read data voltage signal along said bit line means so as to restore the data level stored in said multi-bit one transistor dynamic cell whose correct level was distorted during the data reading cycle, or due to the storage capacitor discharge. The data conversion circuit means generates a predetermined set of voltage levels so that each voltage level or subset of voltage levels within said predetermined set of voltage levels represents a specified number of bits, when applied to said bit line means for data restoration or for data storage.

In operation, the data conversion circuit means accesses the buffer memory to receive both said column voltage of said selected side connected to said selected multi-bit one transistor dynamic cell and said reference dummy cell column voltage. The data conversion circuit calculates the difference between said column voltage of said selected side connected to said selected multi-bit one transistor dynamic cell and said reference dummy cell column voltage so as to obtain an amount of voltage level that represents the amount of data stored in said selected multi-bit one transistor dynamic cell. The data conversion circuit compares the amount of voltage level that represents the amount of data stored in said selected multi-bit one transistor dynamic cell to a set of reference voltage levels stored in said data conversion circuit means to obtain an actual count of the number of bits or the amount of data stored in said selected multi-bit one transistor dynamic cell.

The output from comparator 19 adjusts the amount of voltage that represents the amount of data in total bits stored in the selected multi-bit one transistor dynamic cell to be equal to the next higher level of reference voltage within said set of reference voltages stored in the data conversion circuit in the unique case that said amount of data stored in said selected multi-bit one transistor dynamic cell falls in between two referent voltage ranges due to data distortion or storage capacitor discharge, the first of said two reference voltage levels between the immediate next lower level reference voltage and the second of said two reference voltage levels being said immediate next higher level reference voltage.

It uses the correct adjusted read voltage that represents the actual number of bits of data stored in the selected multi-bit one transistor dynamic cell to refresh the selected multi-bit one transistor dynamic cell by applying an appropriate voltage signal to said column bit line of said selected multi-bit one transistor dynamic cell so as to restore the actual charge that represents the actual number of bits presently stored in said selected multi-bit one transistor dynamic cell.

The rate of discharge or data loss due to storage capacitor leakage of said multi-bit one transistor dynamic cell under ambient conditions is predetermined at the time of manufacture of said multi-bit one transistor dynamic cell and said rate of discharge or data loss is used by said data conversion circuit means to refresh or restore the data stored in said multi-bit one transistor dynamic cell before said storage capacitor leakage causes the stored data to decrease from its correct level to the immediate next lower level within said set of reference voltages stored in said data conversion circuit means.

The data conversion circuit means is not used to refresh, to read and to store data in said multi-bit one transistor dynamic cell in the unique case that said multi-bit one transistor dynamic cell is adapted to store only one type of bit of data at a time said one type of bit of data being either a one bit type data or a zero bit type data, whereby instead of using said data conversion circuit means for data reading, data refreshing and data storing said balanced differential sense amplifier is used by applying a fourth voltage signal to the ground voltage referenced transistor of said balanced differential sense amplifier to latch said balanced differential sense amplifier to either read one bit type data stored in said multi-bit one transistor dynamic cell or to read a zero type bit data stored in said multi-bit one transistor dynamic cell and to cause regenerative action of said balanced differential sense amplifier to restore the data distorted due to the reading cycle back to its correct level of either a one bit type or a zero bit type.

Figure 7:
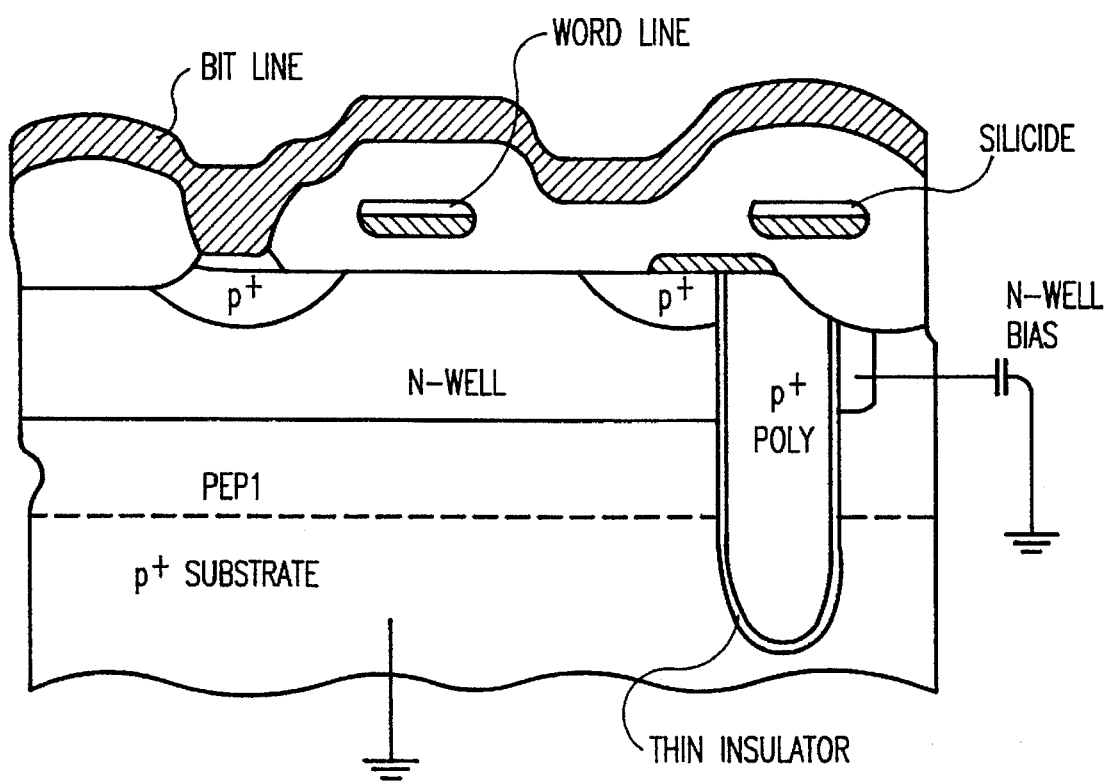
FIG. 7 is a cross-section drawing of the prior-art of a trench type integrated circuit data storage capacitor.
Figure 8:
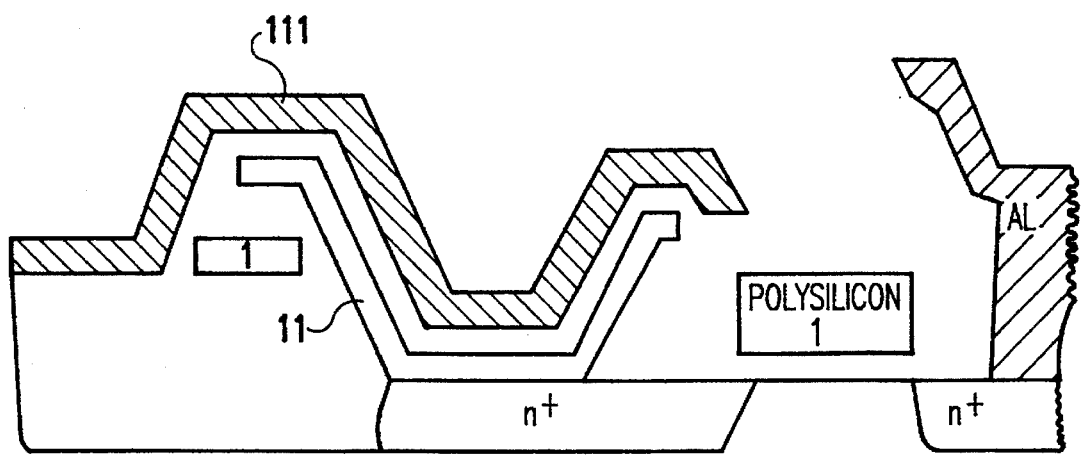
FIG. 8 is a cross-section drawing of the prior art of a stacked-type integrated circuit data storage capacitor.

In order to increase the effective storage area of the data storage capacitor, various storage capacitor designs have been suggested and implemented. One such design is the so-called trench capacitor design shown in FIG. 7 on the stacked capacitor design type shown in FIG. 8. Whatever capacitor design of the present invention is chosen, it should be able to store at least several minimum levels or amounts of charge without increasing the lateral surface area of the capacitor compared to single bit standard storage capacitors, since the main object of this invention is to increase bit storage density. Most important is that the predetermined minimum level or amount of charge must be large enough not to cause soft errors. The predetermined minimum level or amount of charge must also withstand destruction from incident alpha particles that come from the memory packaging material. The storage capacitor, together with its stored charge and the entire memory cell, must also be protected from irregularities caused by supply voltages or the normally called supply voltage bumps.

In general, all noise, both from external and internal sources, must be curtailed to a minimum so that the small predetermined minimum amount of charge that represents one bit of the specified binary type can safely be stably stored on the capacitor.

Hence such a one transistor memory cell with the type of storage capacitor, the safe level or amount of predetermined minimum charge to represent one binary bit type, together with all the above mentioned noise reduction safeguards, is made into a given memory array composed of rows and columns of exactly similar memory cells and these exactly similar memory cells are made into a row and connected to a sense amplifier such as the one shown either in FIG. 4 or the one shown in FIG. 5 in the manner shown.

The charge stored on the data storage capacitor is read as a voltage differential between the two sides of the balanced sense amplifier as is normally the case. However, according to the present invention, the individual transistors that make up the active transistors of the flip-flop of the sense amplifier must have the difference between the threshold voltages of both active amplifiers smaller than the predetermined minimum realized voltage specified to represent one binary bit type, since otherwise the sense amplifier will not detect the total voltage signal realized.

In addition to the safe data storage steps described in the above paragraphs, it is necessary to describe how data is to be stored in such an array of memory cells as described here in this invention, both to facilitate data writing and data reading and to carry out the periodic data refresh cycles.

A specific method for data storage and retrieval is necessary for storing and reading data stored in a memory cell array of this invention and this method as applied to the present invention is described below:

First, an appropriate predetermined amount or level of charge that will cause a corresponding appropriate predetermined amount or level of voltage to represent one binary bit of data, either a high (one) or a low (zero) is specified. The same amount of charge to represent a one can be specified to represent a zero, depending on the complexity of the data signal reading circuits that are employed to read the realized data voltage signal whose amount depends on the number of binary bits of a specified binary type stored on the storage capacitor at the time of reading.

Figure 9:
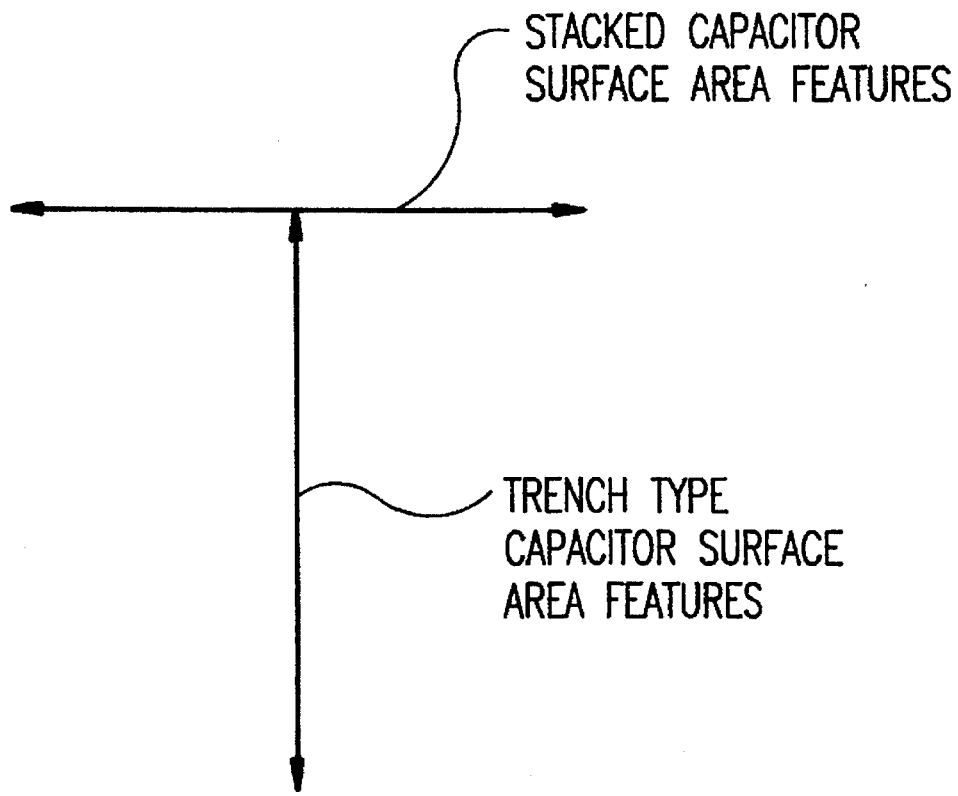
FIG. 9 is a directional drawing of the suggested capacitor type of the preferred embodiment of this invention, so that the effective surface area of the storage capacitor can be increased and hence safe levels of charge be stored therein. This is done by both stacking and then trenching the effective surface area of one capacitor.

Second, the maximum amount of charge that will in turn represent the maximum amount of voltage level that corresponds to the maximum number of binary bits to be stored in the data storage capacitor has to be determined. Hence for increased bit density, the larger in the effective storage surface area of the data storage capacitor without increase in the silicon wafer surface area, the bigger the bit density. As described in earlier paragraphs, construction of a data storage capacitor using a combination of both stacked and trench capacitor design methods as shown in FIG. 9, and the two specific examples of such a capacitor as shown in FIG. 11 and FIG. 12.

Figure 11:
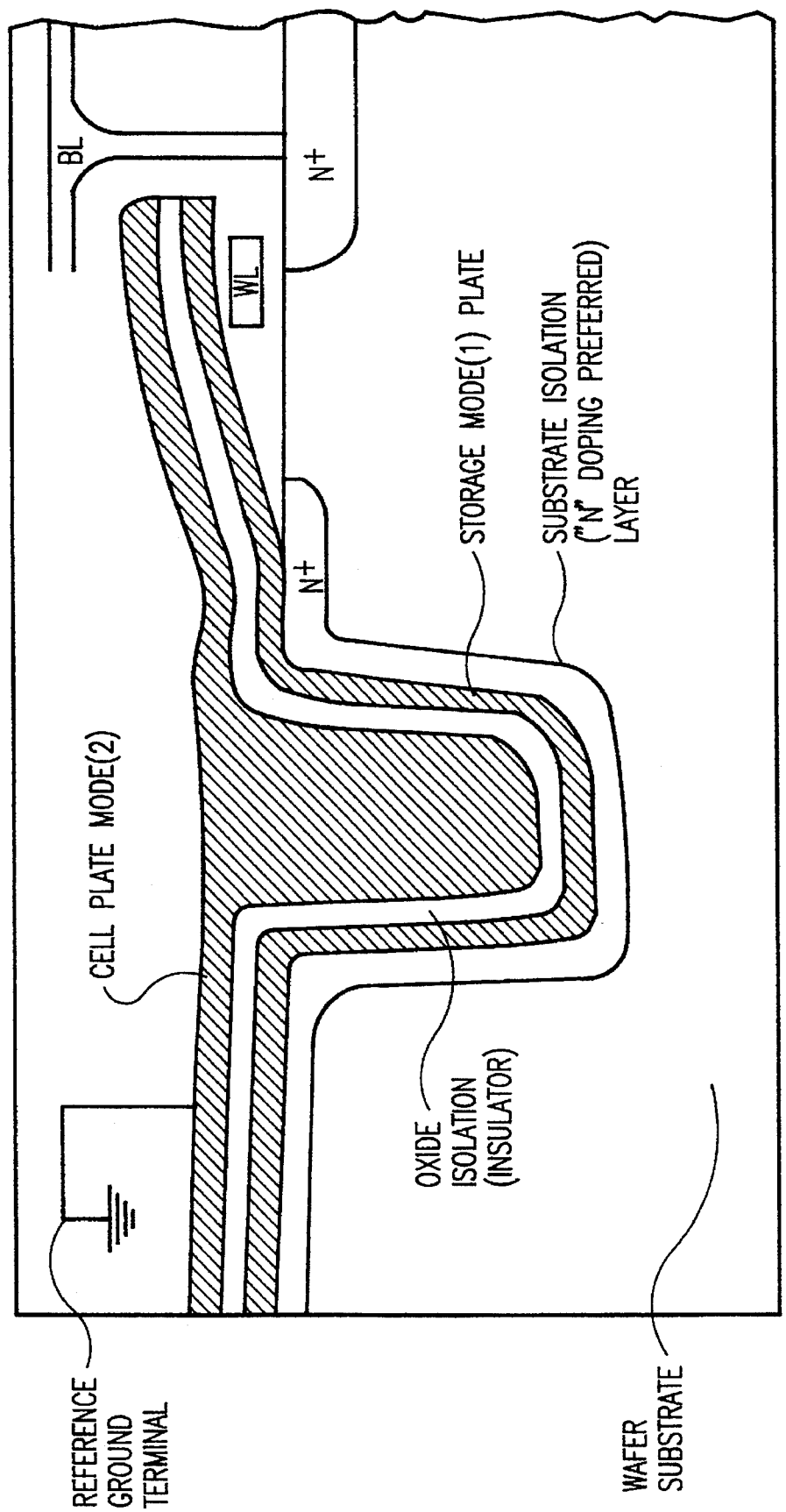
FIG. 11 is a drawing showing a cross-sectional view of the stacked-trenched capacitor design of the multi-bit one transistor dynamic memory cell of this invention. The storage node plate is isolated or insulated from the silicon wafer substrate with an isolation or insulation layer of silicon dioxide doping or preferably a layer of "N" type dopant deposited in the trench shaped part of the data storage capacitor. The storage node plate (1) is stacked along the wafer surface in one or more than one layer, depending on the actual effective surface area of the storage node plate (1) needed and also into the trench shaped part (deep into the substrate), and is preferably extended along the wafer surface and above the word line (wl) to further increase the effective storage surface area of the storage node plate (1).

In FIG. 11, a top to bottom cross-sectional view of the process construction of the type of a stacked and trench capacitor design of the present invention is shown. A single wafer surface layer that extends from the left end of the dynamic cell and is trenched deep into the wafer substrate and back to the right side of the dynamic cell extending all the way above the word line so as to increase the necessary effective surface area for multi-level, multi-bit data storage of the data storage capacitor node plate (1). The data storage capacitor node plate (1) is insulated or isolated in the trench part of the storage capacitor by a layer of silicon dioxide that is first implanted or deposited into the trench. Preferably, a layer of an "N" type dopant should be used to isolate the capacitor storage node plate from the substrate because it is easier and cheaper than silicon dioxide. The storage node plate (1) is isolated or insulated from the cell node plate (2) by another layer of silicon dioxide or some other suitable dielectric insulator or isolator. Also the storage node plate (1), the cell node plate (2) and the dielectric layer separating them is extended well beyond above the word line (WL) so that the effective charge storage area of the storage node plate (1) is maximized.

The storage node plate is isolated or insulated from the substrate with an isolation or insulation layer of a field oxide doping or preferably a layer of "N" type dopant deposited in the trench shape of the capacitor. The storage node plate (1) is stacked both along the surface in one layer or more than one layer depending on the actual effective surface area of the storage node plate (1) needed and also into the trench (deep into the substrate), preferably being built above the insulated word line (WL) to further increase the effective surface area of the storage node plate (1) needed as shown in FIG. 11.

Figure 12:
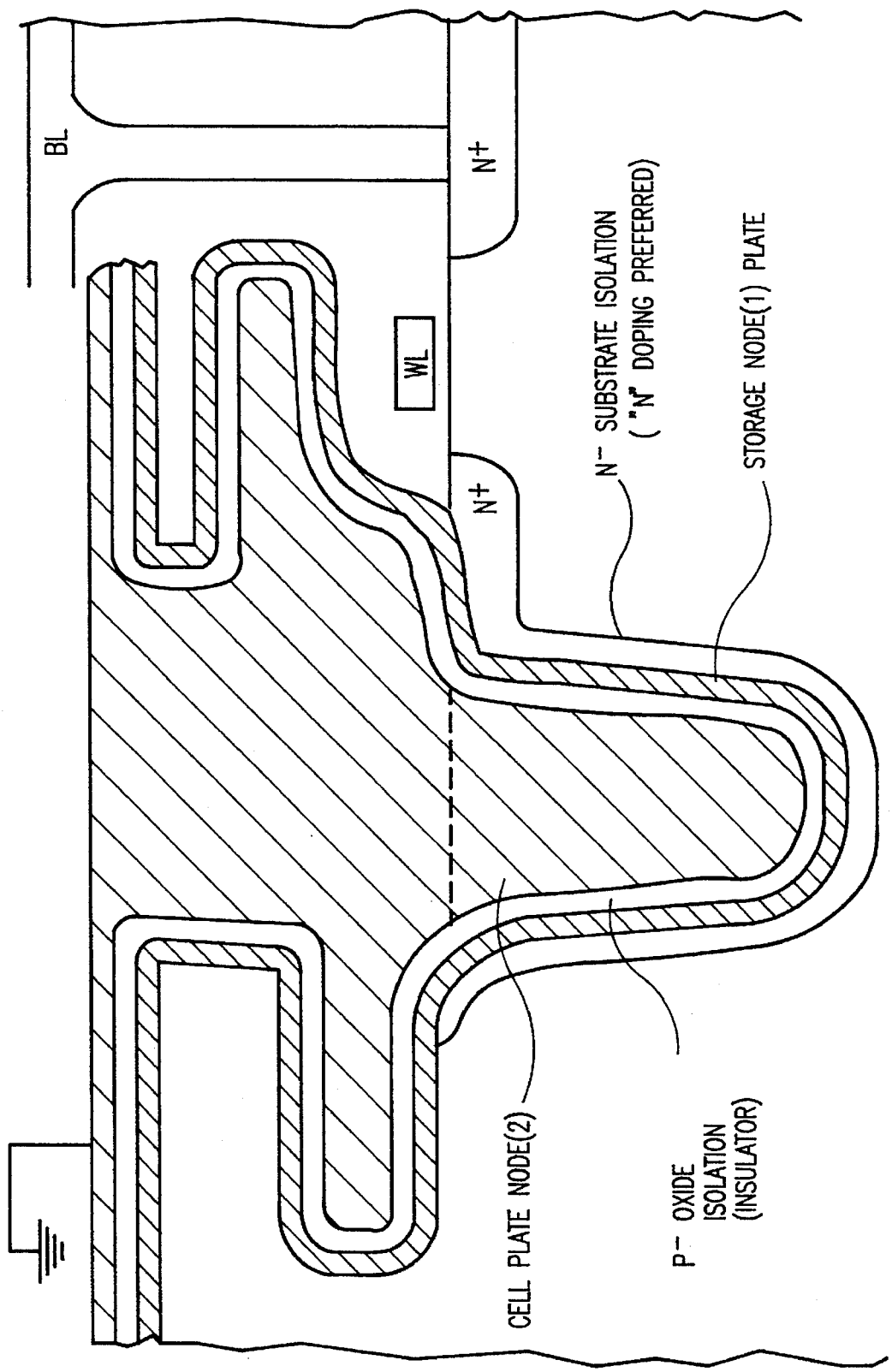
FIG. 12 is a drawing showing a cross-sectional view of the stacked-trenched data storage capacitor design of the preferred embodiment of the multi-bit one transistor dynamic cell showing several wafer surface stacked layers in order to increase the effective storage surface area of the data storage node plate (1) without increasing the wafer surface area occupied by the data storage capacitor. The difference between FIG. 11

The cross-sectional view of the process construction of the stacked-trenched data storage capacitor of FIG. 11 is improved, when necessary, in the drawing shown in FIG. 12 by further increasing the effective data storage surface area of the capacitor by stacking more than one layer on top of the silicon wafer surface area as shown in FIG. 12, where the effective surface area stacked layer of the data storage capacitor is further increased beyond that of FIG. 11 by stacking more than one layer on top of the silicon wafer surface. As many such stacked layers as are possibly necessary can be stacked on top of one another to achieve the desired effective data storage surface area of the storage node plate (1) of the capacitor with no increase in the silicon wafer surface area.

The storage capacitor of this preferred embodiment is larger since it combines both stacked and trench capacitor design methods to increase the usable capacitor plate surface area. However, considering the fact that a 512K memory cell chip size will store 2048K bits of data, for example, if each memory cell is designed to store 4 bits maximum, which bit capacity is equal to two 1-Mb capacity memory cell chips having a far bigger surface area, that the cost of a larger storage capacitor is worth the bit density realized. As a typical example, a normal 1-Megabit DRAM chip is 55 mm$^2$ in size, whereas a 512K Dram chip is comparatively between 27.5 mm$^2$ and 30 mm$^2$.

Two 1-Megabit DRAM chips would occupy about 110 mm$^2$ whereas even to triple the area of the 512K memory chip in order to accommodate the increased size of the data storage capacity to store safe levels of multi-level charge, would bring the size of the 512K memory chip up to only about 90 mm$^2$. Hence chip surface area is saved by using a multi-level memory cell of this invention connected to a single sense amplifier to read all levels of charge stored in the memory cell as depicted in FIG. 4.

Third, it is preferred that data is written and read in terms of bytes or words or double words. Accordingly, given a memory cell array of this invention, it is necessary to specify the exact number of bits (give a standard word length) that each word of data to be stored in the memory cell array will have. For a standard word length of n bits for example, then $2^n$ unique individual addresses (address spaces) are specified with each unique address space (1 to $2^n$) designed to store a unique word and with each individual unique address capable of storing one or more than one such unique word up to a predetermined maximum number of words that depend on the maximum number of binary bits of a specified type that the data storage capacitor of each memory cell within the address space can store at a given time in the form of the allowed maximum electric charge.

For simplification purposes, FIG. 6 is referred to. It is a memory cell array composed of 16 columns and 65536 rows of the memory cells of the present invention. If each single memory cell within this memory cell array was designed to store, for example, 4 binary bits of a specified type, it follows from the description of the above paragraph that each of the 65536 rows or 65536 individual unique addresses is designed to store four unique words each of 16 bits in word length. In other words, each of the individual memory cells of this array is designed to store a maximum of 4 bits of binary data.

In the essence of further clarification, for example, word 1 with binary bit arrangement 0000000000000000 will be stored at row address space 0. Word 2 with binary bit arrangement 0000000000000001 will be stored at row address space 1. Word 3 with binary bit arrangement 0000000000000010 will be stored at row address space 2 and so on. And word 65534 with binary bit arrangement 1111111111111101 will be stored at row address space 65533. Word 65535 with binary bit arrangement 1111111111111110 will be stored at row address space 65534 and finally word 65536 with binary bit arrangement 1111111111111111 will be stored at row address space 65535.

As many words as needed up to a predetermined design maximum can be stored at any one address space, for example, row address space 65535 can store a maximum of four words, each with the specific bit arrangement 1111111111111111. Likewise, Row Address Space 0 can store a maximum of four words, each with the binary bit arrangement 0000000000000000.

In addition to the above described arrangement of data, it is suggested that the memory cell array interface circuit system should contain a map or a directory that shows the address space available and how data in bytes, words, double words, etc., etc. is to be written in the memory cell array. This map or directory may be software dependent (reprogrammable) or changeable or it may be hardware dependent (determined at the time of manufacture of the memory cell array). Whatever dependency is used, this arrangement of data speeds up memory access times, allows for easier detection of errors that may have occurred to the stored data of one or several memory cells within an address space since the number of binary bits (whether ones or zeros) read from each memory cell array row address space is the same for each memory cell within the same row address space, because data is stored in predetermined word lengths such as bytes, words, double words, etc., etc. If a given row address space is presently storing four words, then each memory cell comprising this specific address space is storing four bits of data either all ones or all zeros.

Referring to FIG. 2 now, in order to write data in the cell, the cell is activated by setting a predetermined voltage signal on row select line 26 using a row address decoder circuit (not shown in FIG. 2). Then, by setting another predetermined voltage signal on column line 28, data is stored as a predetermined amount of charge on storage capacitor $C_2$, Section 32. Since storage capacitor $C_2$, Section 32 of FIG. 2 is a variable capacitor, in the sense that it can store multi-level amounts of charge, with each such level of charge representing one bit of data of a specified type, for every bit to be stored on storage capacitor $C_2$, Section 32, Row Select Line 26 is activated by the row address decoder circuit thereby turning on transistor $T_{30}$. A predetermined voltage signal is applied to Column Line 28 and the additional bit of a specified type in the form of a predetermined amount of charge to represent one such bit is stored on storage capacitor $C_2$, Section 32. The above named process is repeated for every binary bit of the specified type to be stored in the cell until the maximum number of bits are written into the cell.

In addition, each memory cell can store one or more than one bits of data of a specified type, such as all ones or all zeros, but not a combination of both bits in one memory cell. This is necessarily convenient so that the data reading circuits are less complicated and small in size in the spirit of minimizing chip surface area and can quickly and efficiently determine the maximum number of binary bits of a specified type stored in the memory cell, at any one time. Column Capacitor $C_{31}$, Section 34 is used in the data reading cycle and will be explained shortly.

Figure 10:
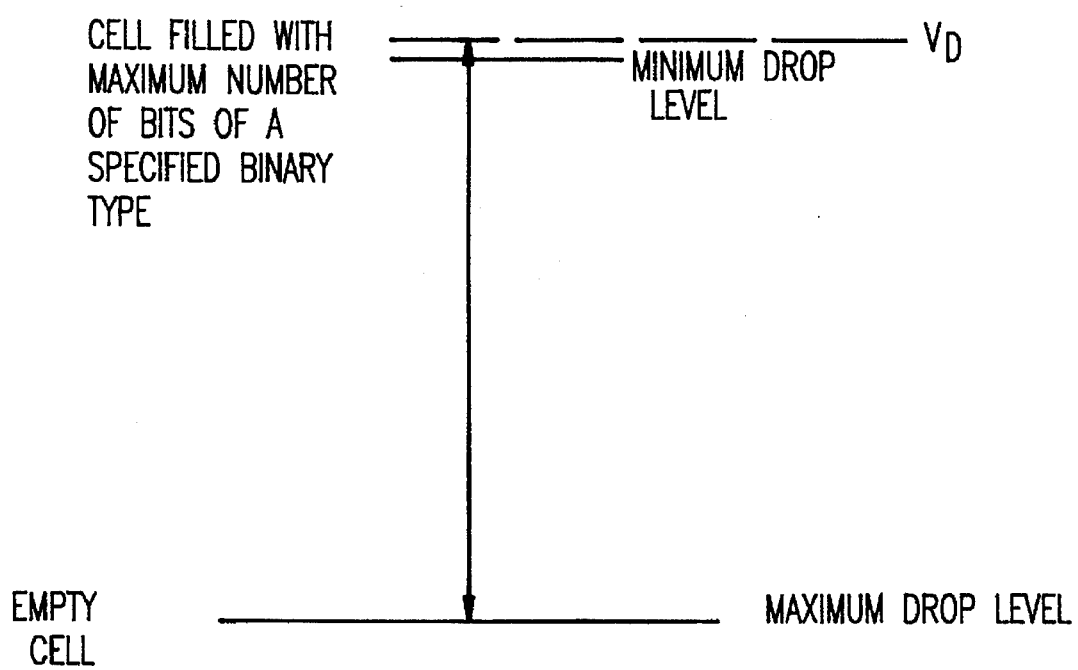
FIG. 10 shows a drawing regarding how multi-bit data is read in the memory cell of FIG. 2 when it is connected to one sense amplifier that reads all the levels (amounts) of data stored in the memory cell as shown in FIG. 4.

In order to read the data stored as above in the memory cell of this invention, FIG. 4 is chosen as a specific example, which is also non-binding, because other arrangements are possible. FIG. 4 comprises one row and 256 columns of individual memory cells of this invention. This memory cell array of 256 memory cells is divided into half so that half the memory cells in the row are connected to one (left) side of a balanced flip-flop sense circuit and the other half is connected to the other side (right). Hence two rows of memory cells are made, one on the left side and the second on the right side of the sense amplifier circuit using signal $\phi_p$ sets all voltages and all columns near the supply level VDD and all dummy cells to zero. When one row, either in the left or right array of the storage cell is selected with a signal $\phi_R$, the dummy cell on the opposite side of the sense amplifier is selected at the same time with a signal $\phi_D$, the column voltage (reference voltage) of the side connected to the dummy cell drops as the column charge is shared with the dummy cell capacitor $C_d$ in FIG. 4, which is also Column Capacitor $C_3$, Section 34 of FIG. 2. The column voltage of the side connected to the selected storage cell 128 drops considerably to a predetermined level for a memory cell that is empty (a memory cell without any stored data either representing one or more binary bits of ones or representing one or more binary bits of zeros), or it changes predeterminedly according to the number of bits of a specified type either all ones or all zeros stored in the memory cell at the time. In other words, the drop in column voltage of the side connected to the selected storage cell 128 depends on the amount of charge and hence the number of bits of a specified type stored in the memory cell. It drops to the maximum predetermined level for an empty memory cell that has no data for either one bit or more than one bits of ones or a zero bit or more than one bits of zeros, and it drops to the minimum predetermined level or does not change at all for the memory cell stored with the maximum number of binary bits of a specified type, all being either all ones or all zeros, but not a combination of both on one memory cell. To put it another way for purposes of clarification, the drop in column voltage of the side connected to the selected storage cell 128 of FIG. 4, depends on the amount of charge and hence to the number of binary bits all belonging to a specified binary type, stored in the memory cell at the time. It drops the most for an empty cell, empty of any bits representing either a one or a zero and it drops the least or does not change at all for a memory cell that has the maximum number of binary bits all of any one binary type stored in the memory cell at the time. Please refer to FIG. 10 where the drop in the selected storage cell column voltage is shown depending on the number of binary bits stored in the memory cell.

The difference in column bit line voltage between the selected storage cell 128 (or any other selected storage cell) on one side of the balanced differential sense amplifier circuit means of FIG. 4 and the reference dummy cell on the opposite side of the balanced differential sense amplifier is the representative voltage level or amount that determines how many bits are stored in memory cell 128 of FIG. 4 at the time. This is done by connecting the bit line of the selected storage cell 128 on one side of the sense amplifier and the bit line of the referent dummy cell on the opposite side of the sense amplifier to a buffer register or buffer memory and a signal amplifier where such a signal needs to be amplified further, and then to a data conversion circuit means. The data conversion circuit means converts the realized differential voltage signal realized from the sense amplifier into a specific code, then compares that specific code to a pre-determined set of codes stored in said data conversion circuit means, where each code within the said set represents a given number of binary bits, or a given number of binary bits arranged in a specific order.

The data conversion circuit means further comprises a multi-voltage signal level operating circuit that is used to generate the refresh voltage levels to be applied to the column bit lines to refresh the selected cell with the correct data level or correct data amount.

The set of reference codes stored in the data conversion circuit means is used to refresh the selected memory cell as follows: In the given instance that the specific code realized by converting the differential voltage signal provided by the read sense amplifier does not compare or match with any of the reference codes within the set of reference codes stored in the data conversion circuit means, then it has to lie or fall between a given immediate next lower reference code and a given immediate next higher reference code. This irregularity is due to abnormal storage capacitor discharge normally, or may result from soft error faults or supply voltage bumps that may occur in spite of the stored data safeguards mentioned before.

Whatever the reason that causes this stored data distortion, the data conversion circuit means (not shown in FIG. 4) adjusts the read differential voltage code to equal the immediate next higher reference code within the set of reference codes. It is this adjusted read differential voltage code that is used to activate the column bit line of the selected storage cell so that the stored data that was distorted due to the reading process is restored back to its correct value.

In addition, the rate of discharge or data loss due to storage capacitor leakage under ambient operating conditions is predetermined at the time of manufacture of said multi-bit, multi-level one transistor dynamic cell and said rate of discharge or data loss is used by the data conversion circuit means to periodically refresh or restore the data stored in said multi-bit one transistor dynamic cell before said storage capacitor leakage causes the stored data to decrease from its correct level to the immediate next lower level within said set of reference voltage codes stored in said data conversion circuit means.

It is important to note according to the preferred embodiment of this invention, presently described, that an empty storage memory cell condition, a zero storage memory cell condition and a one storage memory cell condition are all represented. Hence unlike most binary memory cell storage systems that represent either a one storage memory cell condition or a zero storage memory cell condition, the preferred embodiment of this invention represents three primary memory cell storage conditions and their multiplicity, with the lowest multiplicity being a 1 bit unit of either an empty memory cell or a stored zero bit or a stored one bit and the highest multiplicity being the maximum number of binary bits permissible to be stored in the memory cell for each of the three conditions. The empty memory cell condition and all its multiplicity is ignored for the purposes of data storage and is used only by the memory cell interface to indicate to the user of the system into which this memory cell is embodied or to other parts of the digital system into which the memory cell of the present invention is embodied that the memory cell is empty of any data.

The multi-bit one transistor dynamic cell described can also be adapted to store one bit at a time, either a one (1) or a zero (0) as is normally the standard. This may be necessary to take advantage of safe storage data levels provided by the increased effective storage surface area of the data storage capacitor while decreasing the size of all the other memory cell components.

In such a case as mentioned above, then the data conversion circuit means (not shown in FIG. 4) that is connected to the column bit lines to read and refresh data is not needed. Instead, a fourth voltage signal is applied normally to the ground voltage referenced transistor of the balanced differential sense amplifier so as to latch the sense amplifier to either read a one (1) bit or a zero (0) bit stored in the selected memory cell and to cause regenerative action of said balanced differential sense amplifier to restore the data that is distorted due to data reading or to periodically refresh the distorted data due to normal capacitor leakage or discharge back to its correct level of either a one (1) bit or a zero (0) bit, as in the normal or standard case of the read/refresh cycle of the sense amplifier circuit means of FIG. 4. The fourth signal is shown as signal $\phi S$ in FIG. 4 and the ground voltage referenced transistor of the sense amplifier is shown with signal $\phi S$ applied to its gate terminal and is specifically used only for a one bit storage adaptation of the dynamic cell system of the present invention.

The present invention is now fully described with specific reference to the preferred embodiment. Other embodiments, however, are possible. For example, other balanced circuit sense amplifiers that are more sensitive than the one shown in FIG. 4 and can thus detect lower differential sense voltage signals may be used. One such sense amplifier is shown in FIG. 5. Also another sense amplifier with less components than the one shown in FIG. 4 may be used.

In addition, if it is determined not to drastically increase the effective area of the data storage capacitor, which increase would result into the providing of an appropriate predetermined minimum charge to represent a bit unit of either a one bit or a zero bit or both bits that will not be affected by alpha particle interference and soft error faults, then a data correction circuit either on chip or off chip should be included, preferably between the sense amplifier and the buffer register, so that these errors are corrected before the data is converted to a code to determine how many bits are stored into the memory cell. Alternatively, this data correction circuit may be part of the data conversion circuit so that the data is corrected by the same circuit, then converted.

Further, instead of storing data in bytes, words, double words etc., etc. as suggested and described herein, data may be stored in such a memory cell array using other methods, such as letting a given read voltage level present a specific number of binary bits (ones and zeros) arranged in a specific order, either as double digits, half bytes, bytes, words, double words etc., etc., where such doubled digits, half bytes, bytes, words, double words, etc., etc. contain both ones and zeros.

Other modifications, such as including a supply voltage regulator to protect the data signals from supply voltage irregularities are possible, whether the regulator is on chip or off chip.

The embodiment of this invention described herein, however, is preferred over other embodiments because it provides increased bit density in terms of increased stored bits per unit surface area while ensuring that data correction circuits and voltage regulator circuits are not necessary since the minimum bit representative charge is made large enough in order to withstand noise and safely be stored on the storage capacitor. In addition, making each memory cell of this preferred embodiment store one or more than one bit of a specified binary type ensures that iterative stored data conversion techniques that slow down memory read access times are not used and instead data is quickly and efficiently converted without the need for complicated stored data conversion circuitry.

In addition, the present DRAM memory invention saves electrical energy over existing DRAM memory cells because the individual cells store more than one bit of data and therefore the electrical signals travel far shorter distances. Accordingly, electrical energy is saved.

Accordingly, the scope of this invention should not be limited to the preferred embodiment described herein, since other modifications and changes are possible and should be construed as included herein.

What I claim is:

1. A one transistor multi-bit dynamic memory cell comprising:

(a) a switching transistor means for switching on said one transistor multi-bit dynamic memory cell;

(b) a data storage capacitor means constructed in such a way that said data storage capacitor means has a wafer-surface stacked structure in combination with a deep wafer substrate trenched structure, said wafer-surface stacked structure and said deep wafer substrate trenched structure both comprising in uniform combination a storage node plate of appropriate material, or cell node plate that is pre-charged to a reference ground voltage level and an insulator or dielectric layer that is constructed in between said storage node plate and said cell node plate, said storage node plate, said cell node plate and said insulator or dielectric layer being capable of being stacked in several layers on the surface of the wafer of said multi-bit one transistor cell and above a row address word line, in order to increase the effective surface area of said data storage capacitor for the purpose of multi-bit storage without increasing the overall wafer surface area occupied by said data storage capacitor, whereby said storage node plate is further insulated from signal leakage in the trenched structure areas by first depositing an appropriately doped layer of field oxide or preferably an "N" type doped layer;

(c) a bit line means whose first end is connected to said storage node plate of said data storage capacitor and whose length is connected to a source terminal of said switching transistor and a drain terminal of said switching transistor in such a way that an applied signal on said bit line means when said switching transistor is appropriately turned on can either flow from source to drain so as to charge said data storage capacitor during the process of data storage or data writing or flow from drain to source so as to provide the stored data signal to a sense amplifier circuit during the process of data writing;

(d) a decoder driven row address word line connected to a gate terminal of said switching transistor of said multi-bit one transistor dynamic cell for turning on said switching transistor during the process of data writing, data reading and data restoration.

2. The multi-bit one transistor dynamic cell of claim 1 wherein said switching transistor exhibits symmetry in construction and hence said source terminal and said drain terminal can be connected interchangeably with no change in the results of operation.

3. The multi-bit one transistor dynamic cell of claim 1 wherein said bit line means is connected to a balanced differential sense amplifier circuit means, a buffer memory or a buffer register, and a data conversion circuit means, said data conversion circuit means further comprising a means for sending back an adjusted read data voltage signal along said bit line means so as to restore the data level stored in said multi-bit one transistor dynamic cell whose correct level was distorted during the data reading cycle, or due to the storage capacitor discharge.

4. The data conversion circuit means of claim 3 wherein said data conversion circuit means further comprises a means for generating a predetermined set of voltage levels so that each voltage level or subset of voltage levels within said predetermined set of voltage levels represents a specified number of bits, when applied to said bit line means for data restoration or for data storage.

5. A method of reading data stored in a multi-bit one transistor dynamic cell comprising the steps of:

(a) building a dynamic cell array composed of a predetermined number of rows and columns of said multi-bit one transistor dynamic cells;

(b) splitting said array into two equal halves in a left to right manner or a north to south manner and connecting a balanced differential sense amplified between the left half and the right half of said array or between the north half and the south half of said array;

(c) connecting all gate terminals of said multi-bit one transistor dynamic cells of said dynamic cell array to a new address decoder driver lines and all connecting all gate terminals of said multi-bit one transistor dynamic cells belonging to either half of said dynamic cell array to a new address decoder driver and all column bit lines belonging to one half of said dynamic cell array to a corresponding side of said balanced differential sense amplifier; a buffer memory and a data conversion circuit means;

(d) providing a predetermined supply voltage signal to said balanced differential sense amplifier and to said dynamic cell array;

(e) applying a first predetermined voltage signal to set all voltage and all column lines near said supply voltage provided to said balanced differential sense amplifier and to set all dummy cells of said balanced differential sense amplifier to a predetermined reference voltage;

(f) selecting one row either in the left half side or the right half side of said dynamic cell array and applying thereon a second predetermined voltage signal using said row address decoder driver circuit means and;

(g) simultaneously providing a third predetermined voltage signal to the dummy cell on the opposite side of said balanced differential sense amplifier so as to cause said dummy cell on the opposite of said balanced differential sense amplifier to be selected;

(h) letting the column voltage of the side of said dynamic cell array connected to said dummy cell drop to a predetermined reference level as the column charge is shared with the capacitor of said dummy cell;

(i) letting the column voltage of said selected side connected to said selected multi-bit one transistor dynamic cell drop to a predetermined level, said predetermined level representing the amount of charge stored on a data storage capacitor of said multi-bit one transistor dynamic cell, whereby the drop in said predetermined level of said column voltage is maximum for said data storage capacitor without any charge or data stored thereon, and is minimum for said data storage capacitor filled with the maximum amount of charge or maximum amount of data in terms of binary bits stored thereon;

(j) Enabling a buffer memory or register to receive said column voltage of said selected side connected to said selected multi-bit one transistor dynamic cell and said reference dummy cell column voltage;

(k) enabling a data conversion circuit means to access said buffer memory to receive both said column voltage of said selected side connected to said selected multi-bit one transistor dynamic cell and said reference dummy cell column voltage;

(l) letting said data conversion circuit calculate the difference between said column voltage of said selected side connected to said selected multi-bit one transistor dynamic cell and said reference dummy cell column voltage so as to obtain an amount of voltage level that represents the amount of data stored in said selected multi-bit one transistor dynamic cell;

(m) using said data conversion circuit means to compare said amount of voltage level that represents the amount of data stored in said selected multi-bit one transistor dynamic cell to a set of reference voltage levels stored in said data conversion circuit means to obtain an actual count of the number of bits or the amount of data stored in said selected multi-bit one transistor dynamic cell;

(n) adjusting said amount of voltage that represents the amount of data in total bits stored in said selected multi-bit one transistor dynamic cell to be equal to the next higher level of reference voltage within said set of reference voltages stored in said data conversion circuit in the unique case that said amount of data stored in said selected multi-bit one transistor dynamic cell falls in between two referent voltage ranges due to data distortion or storage capacitor discharge, the first of said two reference voltage levels between the immediate next lower level reference voltage and the second of said two reference voltage levels being said immediate next higher level reference voltage;

(o) using the correct adjusted read voltage that represents the actual number of bits of data stored in said selected multi-bit one transistor dynamic cell to refresh said selected multi-bit one transistor dynamic cell by applying an appropriate voltage signal to said column bit line of said selected multi-bit one transistor dynamic cell so as to restore the actual charge that represents the actual number of bits presently stored in said selected multi-bit one transistor dynamic cell.

6. The methods of claim 5 wherein the rate of discharge or data loss due to storage capacitor leakage of said multi-bit one transistor dynamic cell under ambient conditions is predetermined at the time of manufacture of said multi-bit one transistor dynamic cell and said rate of discharge or data loss is used by said data conversion circuit means to refresh or restore the data stored in said multi-bit one transistor dynamic cell before said storage capacitor leakage causes the stored data to decrease from its correct level to the immediate next lower level within said set of reference voltages stored in said data conversion circuit means.

7. The methods of claim 5 wherein said data conversion circuit means is not used to refresh, to read and to store data in said multi-bit one transistor dynamic cell in the unique case that said multi-bit one transistor dynamic cell is adapted to store only one type of bit of data at a time said one type of bit of data being either a one bit type data or a zero bit type data, whereby instead of using said data conversion circuit means for data reading, data refreshing and data storing said balanced differential sense amplifier is used by applying a fourth voltage signal to the ground voltage referenced transistor of said balanced differential sense amplifier to latch said balanced differential sense amplifier to either read one bit type data stored in said multi-bit one transistor dynamic cell or to read a zero type bit data stored in said multi-bit one transistor dynamic cell and to cause regenerative action of said balanced differential sense amplifier to restore the data distorted due to the reading cycle back to its correct level of either a one bit type or a zero bit type.

* * * * *

UNITED STATES PATENT AND TRADEMARK OFFICE
CERTIFICATE OF CORRECTION

PATENT : 5,640,350

DATED : June 17, 1997

INVENTOR(S) : Adam Sempa Iga

It is certified that error appears in the above-identified patent and that said Letters Patent is hereby corrected as shown below:

On the title page, insert the following:
--Related U.S. Application Data
[60] Provisional application No. 60/016,604, May 1, 1996--.

Column 1, line 3, insert --Reference is made to and priority claimed from U.S. provisional application ser. no. U.S. 60/016,604, filed May 1, 1996, entitled MULTI-BIT DYNAMIC RANDOM ACCESS MEMORY CELL STORAGE --.

Signed and Sealed this

Twenty-eighth Day of July, 1998

*Attest:*

BRUCE LEHMAN

*Attesting Officer*  *Commissioner of Patents and Trademarks*